(12) United States Patent
Boetzer

(10) Patent No.: US 9,872,406 B2
(45) Date of Patent: Jan. 16, 2018

(54) RETENTION-EXTRACTION DEVICE FOR REMOVABLE CARDS IN A CHASSIS

(71) Applicant: Juniper Networks, Inc., Sunnyvale, CA (US)

(72) Inventor: Kenneth D. Boetzer, Scotts Valley, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 444 days.

(21) Appl. No.: 14/696,934

(22) Filed: Apr. 27, 2015

(65) Prior Publication Data

US 2015/0237749 A1 Aug. 20, 2015

Related U.S. Application Data

(63) Continuation of application No. 13/341,733, filed on Dec. 30, 2011, now Pat. No. 9,015,931, which is a continuation of application No. 12/367,633, filed on Feb. 9, 2009, now Pat. No. 8,203,851.

(51) Int. Cl.
*H05K 5/02* (2006.01)
*H05K 7/14* (2006.01)

(52) U.S. Cl.
CPC ......... *H05K 5/0221* (2013.01); *H05K 5/0286* (2013.01); *H05K 7/1461* (2013.01); *Y10T 403/595* (2015.01)

(58) Field of Classification Search
CPC combination set(s) only.
See application file for complete search history.

(56) References Cited

U.S. PATENT DOCUMENTS

| | | | |
|---|---|---|---|
| 5,655,918 A * | 8/1997 | Soh | H01R 13/635 439/159 |
| 5,692,208 A * | 11/1997 | Felcman | G06F 1/1616 312/9.29 |
| 6,171,120 B1 | 1/2001 | Bolich et al. | |
| 6,288,911 B1 * | 9/2001 | Aoki | H05K 7/1409 211/41.17 |
| 6,406,312 B1 | 6/2002 | Heitkamp | |

(Continued)

FOREIGN PATENT DOCUMENTS

EP 2217048 A2 8/2010

OTHER PUBLICATIONS

European Search Repot corresponding to EP 09 17 1633, dated Jun. 24, 2014, 4 pages.

*Primary Examiner* — Lisa Lea Edmonds
(74) *Attorney, Agent, or Firm* — Harrity & Harrity, LLP

(57) ABSTRACT

A retention-extraction device is provided for a removable card in a chassis. The device includes an actuation rod having a cam slot, the actuation rod configured to provide linear movement along the length of the actuation rod, and an extraction lever operatively connected to a proximal end of the actuation rod and pivotally secured to the chassis. The device also includes a bell crank with a cam follower that is configured to ride in the cam slot and a latch hook that pivots between an open and closed position based on the motion of the bell crank. The linear movement of the actuation rod causes the extraction lever to apply a force to a portion of the card and causes the latch hook to pivot to an open position to allow removal of the card.

20 Claims, 6 Drawing Sheets

(56) References Cited

U.S. PATENT DOCUMENTS

| | | | | |
|---|---|---|---|---|
| 7,027,309 B2 * | 4/2006 | Franz | ............... | H01R 13/62933 361/732 |
| 7,203,076 B1 * | 4/2007 | Liang | ..................... | G06F 1/185 361/755 |
| 7,295,447 B2 * | 11/2007 | Strmiska | ............... | H05K 7/1409 312/223.2 |
| 7,301,778 B1 * | 11/2007 | Fang | ..................... | H05K 7/1409 312/223.2 |
| 7,408,788 B2 * | 8/2008 | Rubenstein | .......... | H05K 7/1409 361/754 |
| 7,430,115 B2 * | 9/2008 | Liu | ........................ | G06F 1/187 312/223.2 |
| 7,463,494 B2 * | 12/2008 | Downing | ............... | H05K 5/023 361/732 |
| 8,203,851 B2 * | 6/2012 | Boetzer | ................ | H05K 7/1409 361/801 |
| 9,015,931 B2 * | 4/2015 | Boetzer | ................ | H05K 7/1409 29/750 |
| 2002/0071254 A1 * | 6/2002 | Tien | ..................... | G06F 1/1616 361/727 |
| 2003/0080568 A1 * | 5/2003 | Busby | .................. | A47B 81/06 292/197 |
| 2003/0123221 A1 * | 7/2003 | Liao | ........................ | G06F 1/184 361/679.31 |
| 2004/0008501 A1 * | 1/2004 | Barringer | ............. | H05K 7/1409 361/801 |
| 2004/0066632 A1 * | 4/2004 | Fang | ...................... | G06F 1/184 361/727 |
| 2004/0174685 A1 * | 9/2004 | Hsu | ........................ | G06F 1/184 361/801 |
| 2004/0207992 A1 * | 10/2004 | Puri | ................... | H01R 13/6485 361/801 |
| 2005/0174743 A1 | 8/2005 | Downing et al. | | |
| 2005/0207135 A1 * | 9/2005 | Heussi | ................ | H05K 7/1409 361/801 |
| 2005/0243533 A1 * | 11/2005 | Malone | ................ | H05K 7/1421 361/801 |
| 2005/0243534 A1 * | 11/2005 | Robertson | ............... | G06F 1/184 361/801 |
| 2006/0018105 A1 * | 1/2006 | Suzue | .................. | H05K 7/1409 361/798 |
| 2007/0097662 A1 | 5/2007 | Dean | | |
| 2012/0099284 A1 * | 4/2012 | Boetzer | ................ | H05K 7/1409 361/754 |

* cited by examiner

RETENTION-EXTRACTION DEVICE FOR REMOVABLE CARDS IN A CHASSIS

RELATED APPLICATIONS

This application is a continuation of U.S. patent application Ser. No. 13/341,733, filed Dec. 30, 2011 (now U.S. Pat. No. 9,015,931), which is a continuation of U.S. patent application Ser. No. 12/367,633 filed Feb. 9, 2009 (now U.S. Pat. No. 8,203,851), the disclosures of which are incorporated herein by reference.

BACKGROUND

Electronic devices may be used in many types of systems and/or applications, such as control systems, data processing systems, medical systems, telecommunication systems and/or communication networks. Electronic devices may include system controllers, servers, and/or network devices, such as routers, switches, firewalls, and/or network address translators. For some applications it may be desirable to make electronic devices scalable to accommodate new application requirements. For example, a communication network may be expanded to accommodate new users, modified to accommodate new networking protocols and/or types of data traffic, and/or may be reconfigured in response to network attacks and/or natural disasters.

Scalable electronic devices may be designed to accommodate certain changes. For instance, an electronic device may be configured to include a chassis that accepts removable cards to provide flexibility for accommodating new application requirements. A card may include any device capable of receiving data from another device and/or capable of making data available to another device. Implementations of cards may take the form of removable cards or boards that are configured and adapted for use in an electronic device.

An electronic device may include one or more chassis slots for accepting a removable card. In some cases, retrofit considerations for legacy designs present space constraints for the chassis slots and/or removable cards. Such space constraints may hamper removal of the removable cards since little space is available to manually grasp the card or to include an extraction device.

SUMMARY

In one implementation, a retention-extraction device for a removable card in a chassis is provided. The device includes an actuation rod having a proximal end and a distal end, where the actuation rod is configured to provide linear movement along the length of the actuation rod and where the actuation rod includes a cam slot. The device also includes an extraction lever including a first end and a second end, the extraction lever operatively connected, at the first end, to the proximal end of the actuation rod and pivotally secured, at the second end, to the chassis. The device further includes a bell crank pivotally secured to the chassis, the bell crank including a cam follower, where the cam follower is configured to ride in the cam slot. The device still further includes a latch hook pivotally secured to the chassis, the latch hook operatively connected to the bell crank so as to pivot, based on the motion of the bell crank, between a closed position to secure the card and an open position to release the card, where the linear movement of the actuation rod in the direction of the distal end causes the extraction lever to apply a force to a portion of the card and causes the latch hook to pivot to an open position to allow removal of the card.

In another implementation, a chassis assembly includes an upper chassis guide to receive a first edge of a removable card, a lower chassis guide to receive a second edge of a removable card, and aback plane/mid plane including an chassis connector for the removable card, where the chassis connector is configured to receive a mating connector from the removable card. The chassis assembly also includes a retention-extraction device for the removable card. The retention-extraction device includes a latch hook pivotally mounted to a portion of the chassis, the latch hook configured to pivot between a closed position and an open position; an extraction lever pivotally mounted to another portion of the chassis; and an actuation rod configured to receive a force from a user and substantially simultaneously cause the latch hook to rotate to an open position and cause the extraction lever to apply an extracting force to the removable card.

In a further implementation, a device fore retaining and extracting a card in a chassis may include means for automatically mechanically locking the card to a mating connection within the chassis upon manual insertion of the card; means for receiving an actuation force applied by a user to extract the card from the chassis; means for translating the actuation force to an extracting means; and means for simultaneously unlocking the card and disengaging the card from the mating connection when the actuation force is applied.

In yet another implementation, a chassis assembly may include an upper chassis guide to receive a first edge of an upper removable card, a lower chassis guide to receive a first edge of a lower removable card, and a chassis shelf to receive a second edge of the upper removable card and a second edge of the lower removable card, where the upper chassis guide and the chassis shelf define an upper portion and where the lower chassis guide the chassis shelf define a lower portion. The chassis assembly may also include a back plane/mid plane including an upper chassis connector for the upper removable card and a lower chassis connector for the lower removable card, where the upper chassis connector is configured to receive a mating connector from the upper removable card and the lower chassis connector is configured to receive a mating connector from the lower removable card. The chassis assembly may further include an upper retention-extraction device for the upper removable card and a lower retention-extraction device for the lower removable card. Each of the upper retention-extraction device and lower retention-extraction device may include a latch hook pivotally mounted to a portion of the chassis, the latch hook configured to pivot between a closed position and an open position, an extraction lever pivotally mounted to another portion of the chassis, and an actuation rod configured to receive a force from a user and substantially simultaneously cause the latch hook to rotate to an open position and cause the extraction lever to apply an extracting force to the upper removable card or the lower removable card.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements. Also, the following detailed description does not limit the invention.

Implementations described herein may provide a retention-extraction device for cards in a chassis. The retention-extraction device retains a card through the actuation of a latch hook by way of a connecting rod, from the end of a bell crank which has on the opposite end a cam follower that rides in a cam slot that is part of an actuation rod manipulated directly by a user. The actuation rod also actuates a second class lever that is used to extract the card to the point that connector pins mounted on the card are all disengaged to allow manual removal of the card.

Exemplary Electronic Device Configuration

Figure 1:
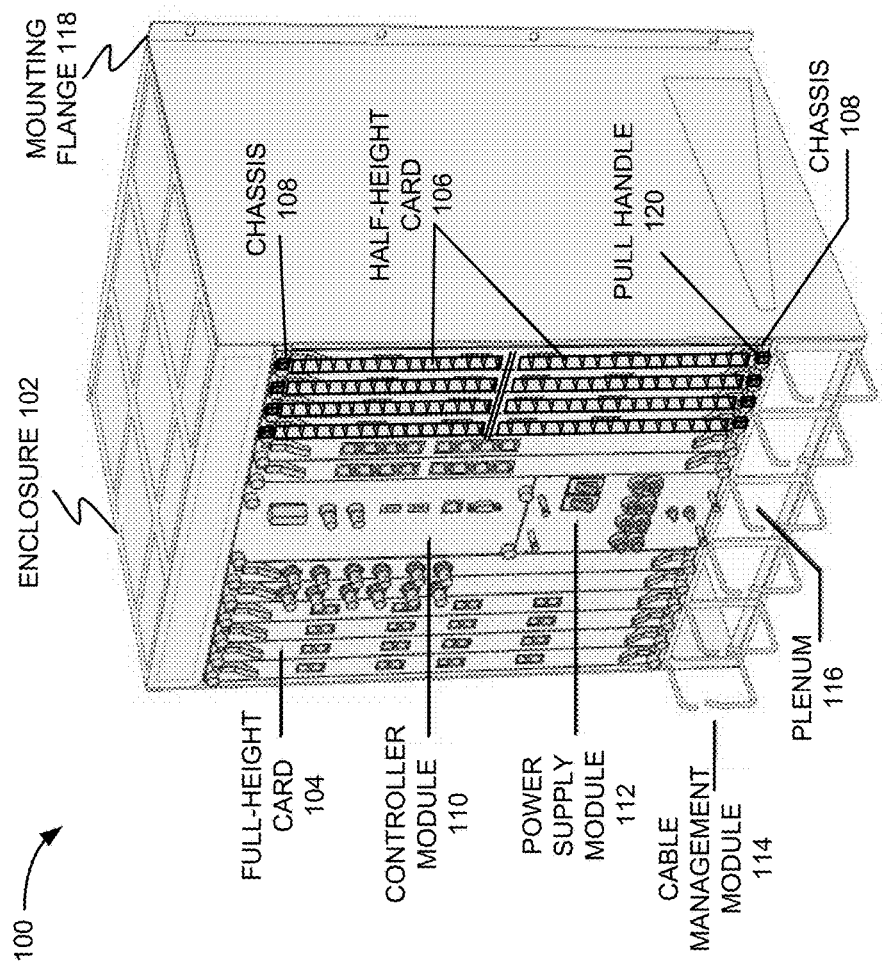
FIG. 1 illustrates an exemplary electronic device 100 in which a retention-extraction device for removable cards may be implemented.

FIG. 1 illustrates an exemplary electronic device 100 in which a retention-extraction device for removable cards may be implemented. Electronic device 100 that may include an enclosure 102, a full-height card 104, a half-height card 106, a chassis 108, a controller module 110, a power supply module 112, a cable management module 114, a plenum 116, and a mounting flange 118. Although FIG. 1 shows exemplary components of electronic device 100, in other implementations, electronic device 100 may contain fewer, different, differently arranged, or additional components than depicted in FIG. 1.

Enclosure 102 may include any structure that can be configured to act as a housing to retain and/or protect a chassis (e.g., chassis 108), removable cards (e.g., full-height card 104 and half-height card 106), and/or other modules that may be used to facilitate operation of electronic device 100. Enclosure 102 may be fabricated from metal, plastic and/or composite and may be sized for particular applications. In one implementation, enclosure 102 may be sized to fit an industry standard mounting structure, such as an equipment rack. Enclosure 102 may include one or more mounting flanges 118 to facilitate attachment of enclosure 102 to a mounting structure, such as an equipment rack. Mounting flange 118 may include one or more mounting holes for accepting fasteners, such as machine screws, for use in attaching electronic device 100 to a mounting structure.

Full-height card 104 and/or half-height card 106 may include any device(s) and/or component(s) that are configured to perform a function while installed in electronic device 100. "Height" as used herein when referring to cards denotes a length associated a card that may be installed in a vertical orientation, a horizontal orientation, and/or another orientation. As described in more detail herein, full-height card 104 and/or half-height card 106 may be removably coupled to electronic device 100 using a retention-extraction mechanism that may be operated using a pull handle 120. Full-height card 104 and/or half-height card 106 may be configured to have a predetermined height and/or depth so as to be retained by chassis 108 inside electronic device 100. In one implementation, full-height card 104 may have dimensions on the order of approximately 15 inches high by approximately 8 inches deep, and half-height card 106 may have dimensions on the order of approximately 7 inches high by approximately 8 inches deep. Full-height card 104, half-height card 106 and/or other types of partial-height cards may be configured to perform certain functions using a combination of hardware and/or software components. For example, in one implementation, full-height card 104, half-height card 106 and/or other types of partial-height cards may be configured to perform packet forwarding, network address translation, data encryption, data processing, and/or data storage using hardware and/or software components.

Chassis 108 may include any device, mechanism and/or structure that may be configured to receive a full-height card 104 or couple two or more partial-height cards 106 into an assembly that can be configured and adapted to fit into a slot within chassis 108 within enclosure 102. Chassis 108 may include a pull handle 120 that is connected to a retention-extraction device within chassis 108. Pull handle 120 may be used to initiate extraction of a card from chassis 108. Chassis 108 is described in more detail below, for example, with respect to FIG. 2.

Controller module 110 may include any device(s) and/or component(s) that are configured to control and/or monitor the operation of one or more cards operating in electronic device 100. Controller module 110 may include a special-purpose computer that can be configured on a full-height card 104 so as to occupy a full-height slot in a chassis 108 within electronic device 100 or may be configured to have a different dimension, such as for mounting in a partial-height card slot or in a dedicated portion of electronic device 100.

Power supply module 112 may include any device capable of providing power to devices operating in electronic device 100. Power supply module 112 may be configured to perform voltage and/or current conversion and may include one or more inputs and/or outputs. In one implementation, power supply module 112 may accept an alternating current (AC) from a wall receptacle and provide a direct current (DC) to devices operating within electronic device 100.

Cable management module 114 may include any device, mechanism and/or structure configured to retain and/or manage cables. In one implementation, cable management module 114 may include guides and/or channels for retaining wires and/or optical fibers associated with full-height card 104, half-height card 106, controller module 110 and/or power supply module 112.

Plenum 116 may include any device, mechanism and/or structure that facilitates and/or directs airflow through electronic device 100. In one implementation, plenum 116 may include one or more openings, or channels, for accepting an input air volume and directing the input air volume across interior portions of full-height card 104, half-height card 106, controller module 110, power supply module 112, and/or other devices, components and/or cards.

As shown in FIG. 1, the face of full-height card 104 and half-height card 106 provide no room for any holes to allow actuation levers or other devices through the face of full-height card 104 or half-height card 106. Instead, for each full-height card 104 or half-height card 106, the retention-extraction device activated by pull handle 120 is implemented outside the envelope of the full-height card 104 and/or half-height card 106 being acted on. As described in more detail herein, the retention-extraction device provides force multiplication to allow removal of full-height card 104 or half-height card 106 with minimal force (e.g., the force of one finger) applied to pull handle 120 and provides positive retention to prevent inadvertent decoupling of full-height card 104 or half-height card 106 from electronic device 100.

Figure 2:
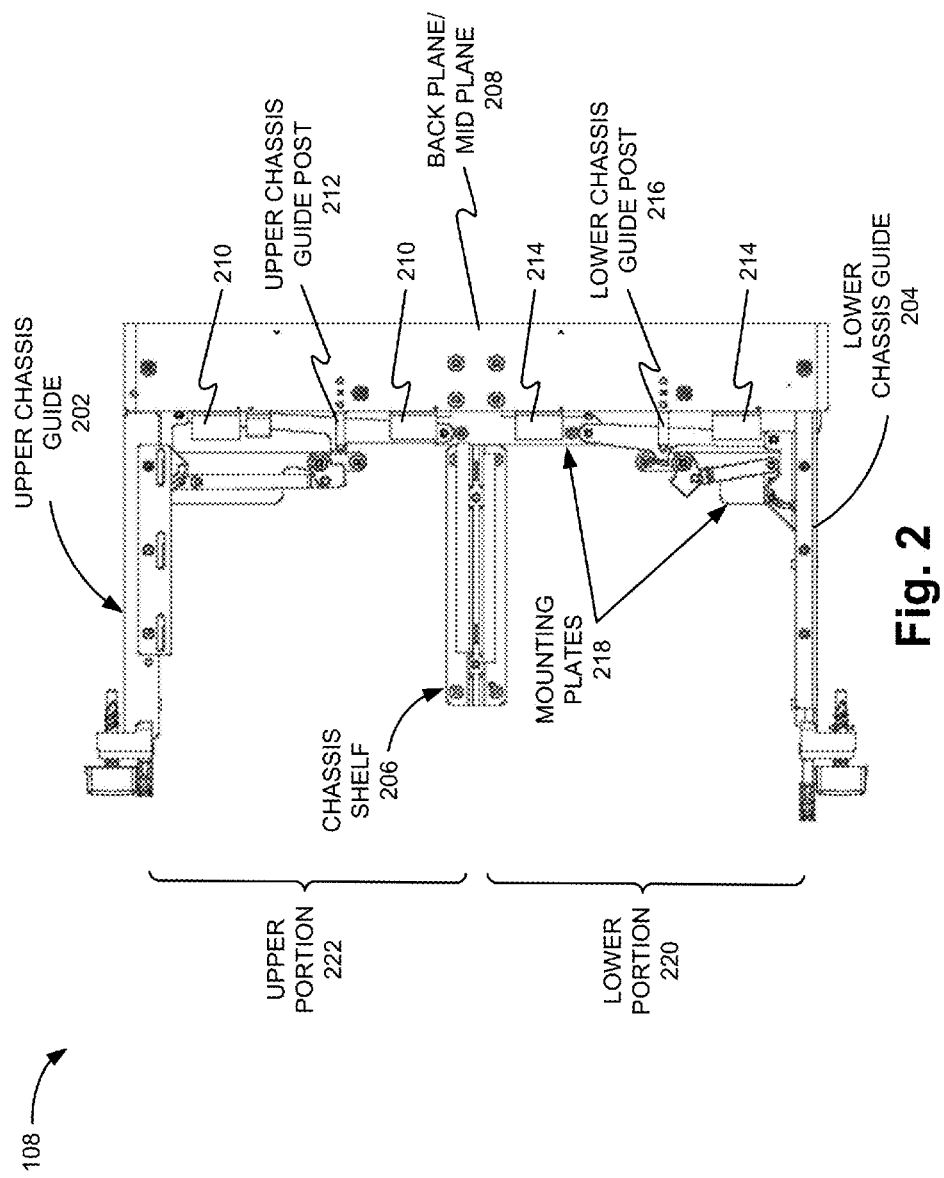
FIG. 2 illustrates a side view of an exemplary full-height chassis configured to accept two partial-height cards.

FIG. 2 illustrates a side view an exemplary full-height chassis 108 configured to accept two partial-height cards (e.g., half-height cards 106) that may be substantially the same height. Other implementations may employ two or more partial-height cards that are not the same height, such as might occur when a ⅓-height card and/or a ⅔-height card operate in conjunction with chassis 108. Partial-height card as used herein refers to any card having a height that is less than the height of a full-height card. Partial-height cards may have the same depth, a longer depth and/or a shorter depth than a corresponding full-height card.

Full-height chassis 108 may occupy an interior portion of enclosure 102 of electronic device 100 and may include an upper chassis guide 202, a lower chassis guide 204, chassis shelf 206, a back plane/mid plane 208, an upper chassis connector 210, an upper chassis guide post 212, a lower chassis connector 214, a lower chassis guide post 216, and/or mounting plates 218. Chassis shelf 206 may divide chassis 108 into a lower portion 220 and/or an upper portion 222. While not necessarily symmetrical, lower portion 220 and upper portion 222 each may be similarly configured to include a retention-extraction device for removable cards.

Upper chassis guide 202 may include any device, mechanism and/or structure that may retain a portion of a card, such as a full-height card 104 and/or a partial-height card 106. In one implementation, upper chassis guide 202 may include a channel configured and adapted to receive an upper (or outboard) edge of a card. Upper chassis guide 202 may retain the upper edge in a desired position relative to back plane/mid plane 208. Lower chassis guide 204 may be substantially identical to upper chassis guide 202 and may be configured to retain a lower (or outboard) edge of a card in a desired position relative to back plane/mid plane 208.

Chassis shelf 206 may include any device, mechanism and/or structure that may retain a portion of a card, such as a full-height card 104 and/or a partial-height card 106. When two partial-height cards are installed in chassis 108 using chassis shelf 206, an upper card may occupy upper portion 222 and a lower card may occupy lower portion 220. Chassis shelf 206 may engage a lower (or inboard) edge of the upper card and may engage an upper (or inboard) edge of the lower card. Chassis shelf 206 may align the upper card and the lower card such that an upper edge of the upper card may engage upper chassis guide 202 and a lower edge of the lower card may engage lower chassis guide 204. In another implementation, chassis shelf 206 may be removed to accommodate a full-height card 104 in chassis 108.

Back plane/mid plane 208 may include any device, mechanism and/or structure that may be configured to support upper chassis guide 202, lower chassis guide 204, chassis shelf 206, upper chassis connector 210, and/or lower chassis connector 214. Implementations of back plane/mid plane 206 may be fabricated from metal and may operate as a ground plane for devices into which chassis 108 is installed.

Upper chassis connector 210 may include any device, mechanism and/or structure capable of making electrical and/or optical signals available to a card having a mating connector associated therewith. In one implementation, upper chassis connector 210 may include a multi-pin connector configured and arranged to receive a mating connector mounted on a card, such as half-height card 106. For example, when half-height card 106 is seated in upper portion 222 of chassis 108, a mating connector on the card may be electrically and/or optically coupled to upper chassis connector 210 so that half-height card 106 may communicate with electronic device 100 and/or other cards installed in electronic device 100. Upper chassis guide post 212 may be configured to receive an alignment hole on half-height card 106 to ensure proper alignment of upper chassis connector 210 with the mating connector mounted on the card.

Lower chassis connector 214 and lower chassis guide post 216 may be configured in a manner substantially identical to upper chassis connector 210 and upper chassis guide post 216, respectively. Configuring upper chassis connector 210 and lower chassis connector 214, and upper chassis guide post 212 and lower chassis guide post 216, in an identical manner may facilitate the use of two half-height cards in full-height chassis 108 in conjunction with chassis shelf 206.

Mounting plates 218 may be provided in one or more locations to secure components of the retention-extraction device to chassis 108. In one implementation, one or more mounting plates 218 may span all or a portion of both lower portion 220 and upper portion 222.

Although FIG. 2 shows exemplary components of chassis 108, in other implementations, chassis 108 may contain fewer, different, differently arranged, or additional components than depicted in FIG. 2. Other components of chassis 108, including components of a retention-extraction device are described below with respect to FIGS. 3-5.

Exemplary Retention/Extraction Device

Figure 3A:
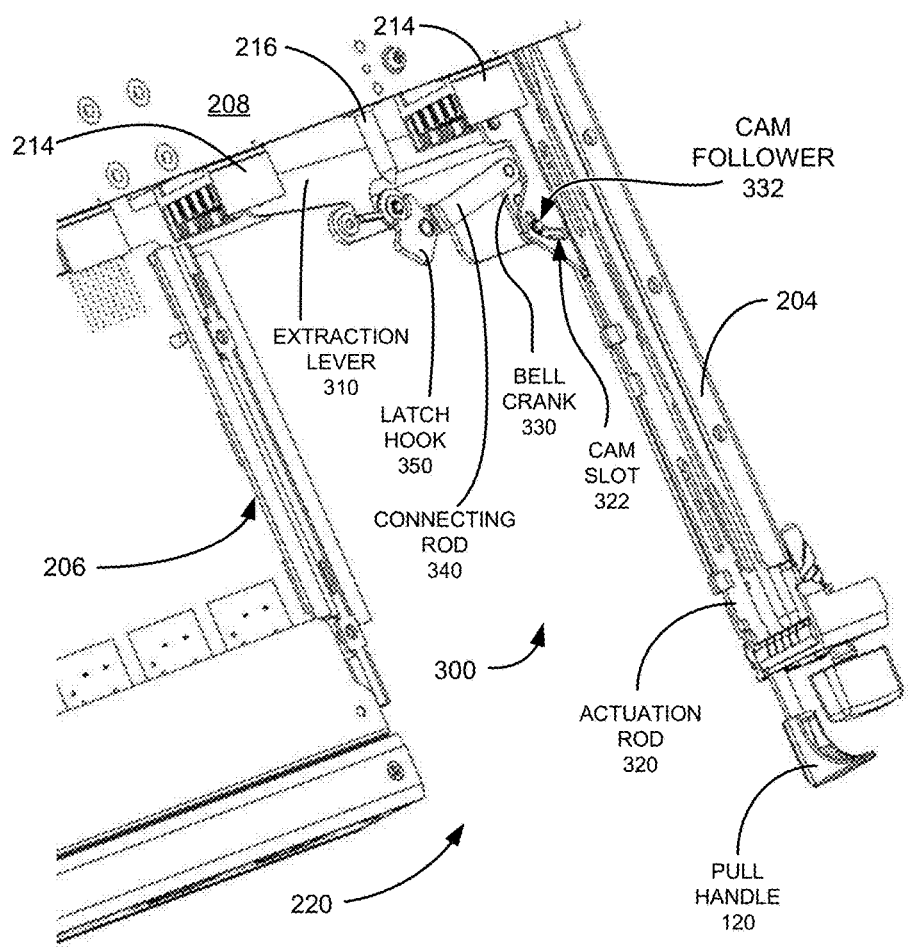
FIG. 3A illustrates a perspective view of an exemplary retention-extraction device.
Figure 3B:
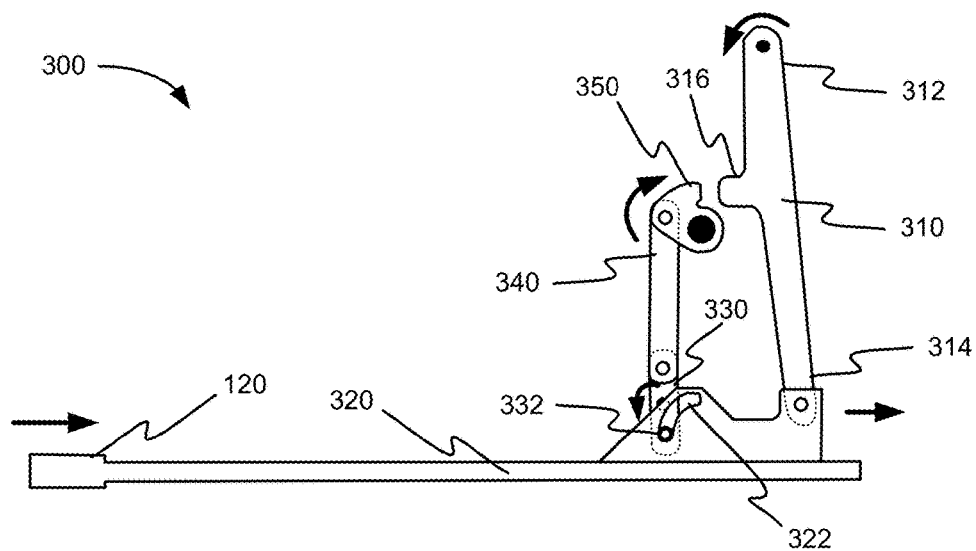
FIG. 3B illustrates a side view of the exemplary retention-extraction device in an open position.
Figure 3C:
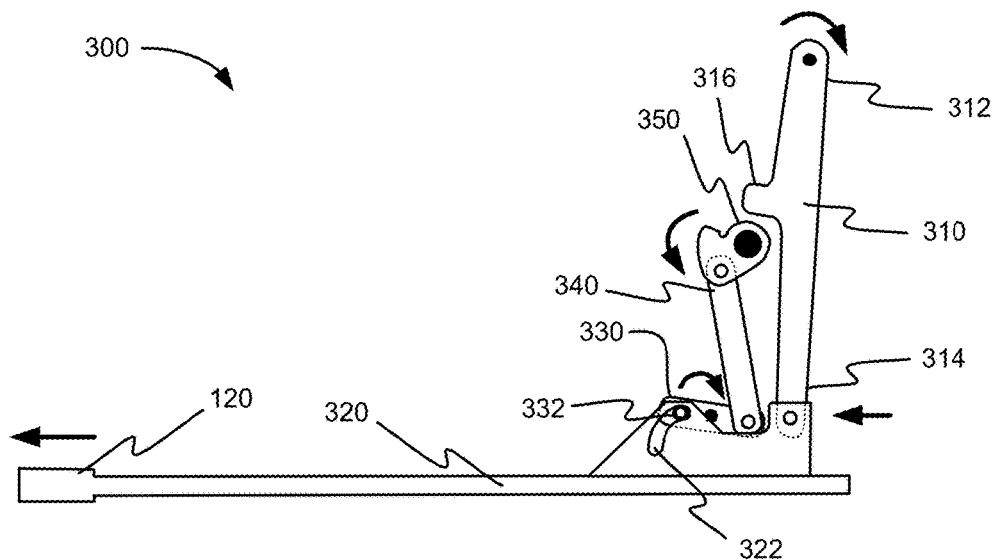
FIG. 3C illustrates a side view of the exemplary retention-extraction device in a closed position.

FIG. 3A illustrates a side perspective view of an exemplary retention-extraction device 300. As shown in FIG. 3A, retention-extraction device 300 may be included in lower portion 220 of chassis 108. FIG. 3B illustrates a side view of exemplary retention-extraction device 300 in an open position. FIG. 3C illustrates a side view of exemplary retention-extraction device 300 in a closed position.

Referring collectively to FIGS. 3A-3C, retention-extraction device 300 may include pull handle 120, an extraction lever 310, an actuation rod 320, a bell crank 330, a connecting rod 340, and a latch hook 350. Retention-extraction device 300 is shown in an open position in FIGS. 3A and 3C, ready to receive a card (e.g., half-height card 106). The card (not shown in FIGS. 3A-3C for clarity) may be inserted (e.g., manually inserted) along channels within, for example, lower chassis guide 204 and chassis shelf 206 to guide the card into lower chassis connector 214. Retention-extraction device 300 is shown in a closed position in FIG. 3B, such that a card may be secured to, for example, lower chassis connector 214.

Extraction lever 310 may have an inboard end 312 closest to chassis shelf 206 and an outboard end 314 closest to lower chassis guide 204. The inboard end 312 of extraction lever 310 may be secured (e.g., via a pin) to a portion of chassis 108 (e.g., mounting plate 218) such that movement of the outboard end 314 of extraction lever 310 may cause extraction lever 310 to pivot about the inboard end 312 in the plane defined by extraction lever 310. The outboard end 314 of extraction lever 310 may be secured (e.g., via a pin) to a portion of actuation rod 320. In between the inboard end and the outboard end, extraction lever 310 may include a protrusion 316 to receive force from and apply force to the card.

Actuation rod 320 may be mounted on a portion of lower chassis guide 204 such that actuation rod 320 may slide linearly along a surface of lower chassis guide 204. Actuation rod 320 may be secured, for example, within a channel in lower chassis guide 204 or with guides and/or clips to restrict lateral movement. Actuation rod 320 may be secured (e.g., via a pin) to the outboard end 314 of extraction lever 310 such that linear movement of actuation rod 320 may cause extraction lever 310 to pivot about the inboard end 314 of extraction lever 310. Actuation rod 320 may also be linked to bell crank 330 to impart partial rotational movement to bell crank 330. More particularly, actuation rod 320 may include a cam slot 322 to receive a cam follower 332 that is rigidly affixed to bell crank 330.

Bell crank 330 may be secured (e.g., via a pin) to a portion of chassis 108 (e.g., mounting plate 218) to allow for partial rotational movement in the plane defined by bell crank 330, as guided by cam follower 332 within cam slot 322. Bell crank 330 may be linked to connecting rod 340, which, in turn may be linked to latch hook 350.

Latch hook 350 may be secured (e.g., via a pin) to a portion of chassis 108 (e.g., mounting plate 218) to allow for rotational movement in the plane defined by latch hook 350. Based on movement from connecting rod 340, latch hook 350 may pivot between an open position (shown in FIGS. 3A and 3C) to allow insertion/removal of a card and a closed position (shown in FIG. 3B) to retain an inserted card.

Pull handle 120 may be rigidly affixed to actuation rod 320 to allow a user to impart a pushing or pulling force to actuation rod 320. In one implementation, pull handle 120 may include a finger grip to allow a finger of a user to pull and/or push pull handle 120. As shown in FIGS. 3A-3C, extraction lever 310 may serve as a second class lever to multiply a pulling force applied to pull handle 120 (and translated through actuation rod 320) and apply the multiplied force to a card at protrusion 316. Thus, if protrusion 316 is located halfway between outboard end 314 and the inboard end 312 of extraction lever 310, a pulling force applied to pull handle 120 may be essentially doubled at protrusion 316.

Although FIGS. 3A-3C show exemplary components of retention-extraction device 300, in other implementations, retention-extraction device 300 may contain fewer, different, differently arranged, or additional components than depicted in FIGS. 3A-3C.

Exemplary Card Assembly

Figure 4:
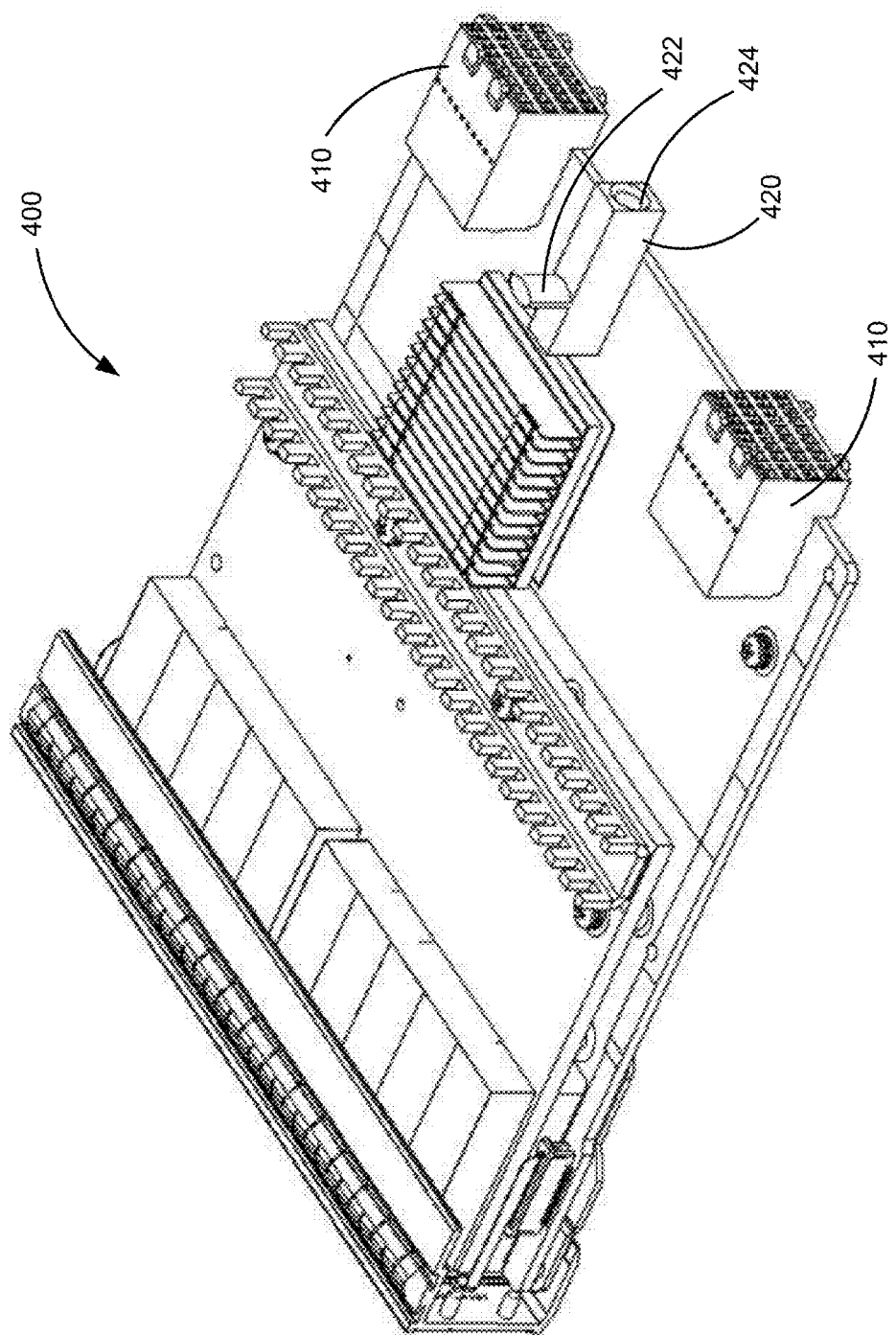
FIG. 4 illustrates a rear perspective view of an exemplary half-height card configured to occupy a portion the chassis of FIG. 2 according to implementations described herein.

FIG. 4 illustrates a rear perspective view of an exemplary half-height card 400 configured to occupy a portion (e.g., lower portion 220 or upper portion 222) of chassis 108 according to implementations described herein. In one implementation, half-height card 400 may be, for example, a modular interface card (MIC). Card 400 may include one or more mating connectors 410 and an alignment piece 420. Alignment piece 420 may include a tab 422 and a centering hole 424. Mating connectors 410 may be configured to be removably connected with upper chassis connector 210 and/or lower chassis connector 214 of chassis 108. Similarly, centering hole 424 may be configured to receive upper chassis guide post 212 and/or lower chassis guide post 216. Tab 422 may configured to contact protrusion 316 of extraction lever 310. Tab 422 may also be configured to engage with latch hook 350 when latch hook 350 is in a closed position.

Although FIG. 4 shows exemplary components of card 400, in other implementations, card 400 may contain fewer, different, differently arranged, or additional components than depicted in FIG. 4.

Examples

Referring collectively to FIGS. 3A-3C and 4, in operation, insertion of card 400 may cause a portion of card 400 (e.g., tab 422) to contact protrusion 316 on extraction lever 310 as the mating connector 410 card 400 engage lower chassis connector 214. The force applied to protrusion 316 by tab 422 during the insertion of card 400 may cause the outboard end of extraction lever 310 to rotate in a counter-clockwise direction (e.g., toward back plane/mid plane 208). The counter-clockwise movement of the outboard end of extraction lever 310 may cause actuation rod 320, along with cam slot 322, to slide forward toward back plane/mid plane 208. The forward motion of actuation rod 320 and cam slot 322 may cause cam follower 332 to rotate bell crank 330. As shown in FIG. 3B, bell crank 330 may rotate in a counter-clockwise direction, causing connecting rod 340 to impart rotational motion to latch hook 350. More particularly, latch hook 350 may pivot from an open position (shown in FIG. 3C) to a closed position (shown in FIG. 3B).

In the closed position (FIG. 3B), latch hook 350 may impede movement of tab 422 to secure card 400 within lower portion 220 of chassis 108 and block removal of card 400. In one implementation, insertion of card 400 into lower portion 220 of chassis 108 may cause latch hook 350 to rotate into a closed position and an additional force (e.g., a push by a user) to pull handle 120 may be used to lock latch hook 350 into place. For example, actuation rod 320 may include a detail that snaps into place against a portion of lower chassis guide 204 when the additional force is applied.

As shown in FIG. 3C, removal of card 400 may be achieved by applying a manual pulling force to pull handle 120 to slide actuation rod 320 rearward away from back plane/mid plane 208. In one implementation, the pulling force applied to pull handle 120 may be sufficient to dislodge actuation rod 320 where it may be secured by the detail to lower chassis guide 204. The rearward motion of actuation rod 320 may simultaneously cause latch hook 350 to rotate to an open position and cause protrusion 316 of extraction lever 310 to apply a rearward force to tab 422 of card 400. The reward force on tab 422 may disengage the mating connector 410 of card 400 from lower chassis connector 214, leaving card 400 available to be grasped and removed by a user.

Figure 5:
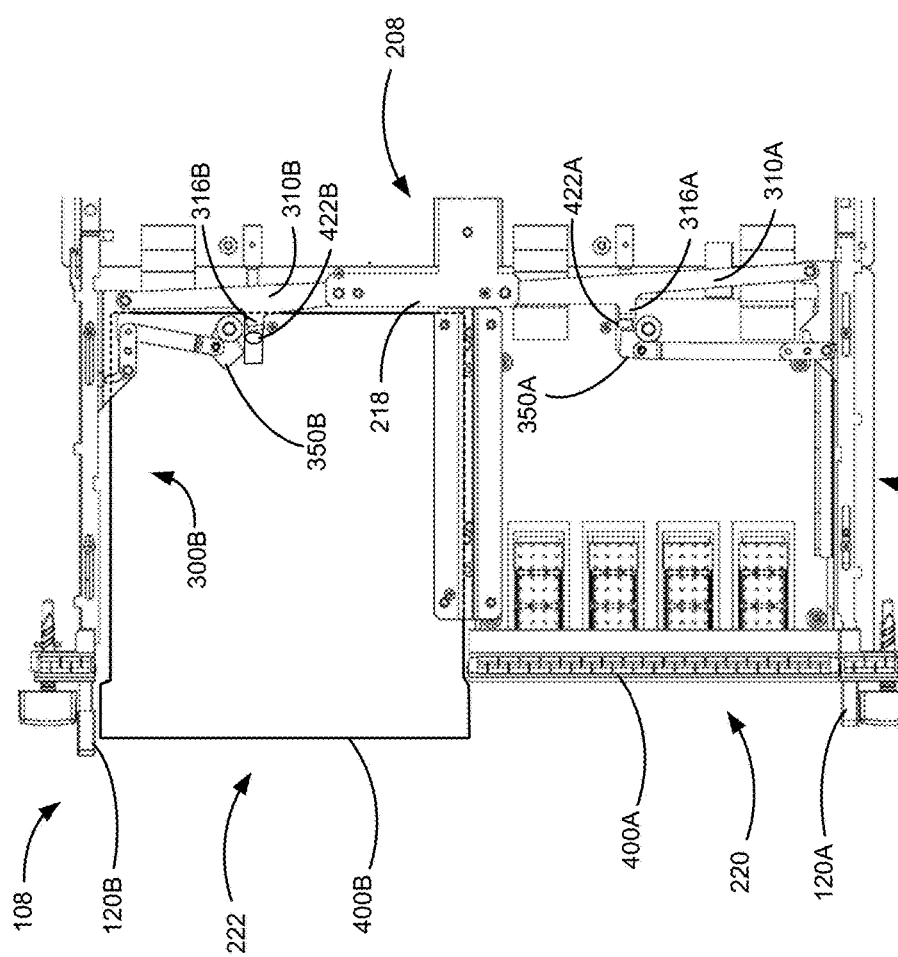
FIG. 5 illustrates a side view of another implementation of an exemplary full-height chassis configured to accept two partial-height cards.

FIG. 5 illustrates a side view of an implementation of full-height chassis 108 configured to accept two partial-height cards (e.g., half-height cards 106) that may be substantially the same height. Lower portion 220 and upper portion 222 of chassis 108 each include a retention-extraction device 300A, 300B. Chassis 108 is shown with card 400A fully inserted into lower portion 220, while upper portion 222 is shown with card 400B partially ejected from upper portion 222. Some mounting plates 218 are not shown in FIG. 5 for clarity.

In lower portion 220, latch hook 350A of retention-extraction device 300A is shown in a closed position around tab 422A of card 400A. Insertion of card 400A into lower portion 220 has caused tab 422A to force protrusion 316A of extraction lever 310A forward toward back plane/mid plane 208. Pull handle 120A is shown in a forward position, pushed in toward back plane/mid plane 208.

In upper portion 222, latch hook 350B of retention-extraction device 300B is shown in an open position. Pull handle 120B is shown in a rearward position, pulled away from back plane/mid plane 208. Accordingly, latch hook 350B would not interfere with tab 422B during removal or insertion of card 400B. The rearward motion of pull handle 120B from a forward position to the rearward position forces protrusion 316B of extraction lever 310B to rotate rearward away from back plane/mid plane 208 and to push against tab 422B to remove card 400B.

CONCLUSION

Implementations described herein may provide a device to hold in place and later facilitate removal of a card in a chassis. Retention and extraction mechanisms are provided outside the envelope of the card being acted on. The device provides force multiplication to allow removal of the card with limited applied force (e.g., the force of one finger). The device also provides positive retention to prevent inadvertent disconnect of any of the contacts.

The foregoing description of implementations provides illustration and description, but is not intended to be exhaustive or to limit the invention to the precise form disclosed. Modifications and variations are possible in light of the above teachings or may be acquired from practice of the invention.

For example, systems described herein can be implemented using assemblies and parts other than those illustrated in the figures and described in the specification without departing from the spirit of the invention. Parts may be added and/or removed from electronic device 100 and/or chassis 108 depending on specific deployments and/or applications. Further, disclosed implementations may not be limited to any specific combination of hardware.

Even though particular combinations of features are recited in the claims and/or disclosed in the specification, these combinations are not intended to limit the disclosure of the invention. In fact, many of these features may be combined in ways not specifically recited in the claims and/or disclosed in the specification.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A chassis comprising:
 a retention device for a removable card,
  the retention device comprising:
   an actuation rod mounted on the chassis,
   a lever,
    a first end of the lever being connected to an end of the actuation rod,
    a second end of the lever being connected to the chassis, and
   a latch hook connected to the chassis,
    the latch hook pivoting between a first position and a second position,
    the first position allowing the removable card to be inserted into the chassis or removed from the chassis, and
    the second position allowing the removable card to be retained within the chassis.

2. The chassis of claim 1, the retention device further comprising:
 a connection rod,
  a first end of the connection rod being connected to the latch hook.

3. The chassis of claim 2, where the retention device further comprises:
 a bell crank connected to the chassis,
  a second end of the connection rod being connected to the bell crank.

4. The chassis of claim 1, further comprising:
 a pull handle connected to the retention device,
  the pull handle being used to remove the removable card from the chassis.

5. The chassis of claim 4, where the pull handle comprises a finger grip.

6. The chassis of claim 1, where the retention device further comprises a bell crank secured to a mounting plate of the chassis,
 where a cam follower is affixed to the bell crank, and
 where the actuation rod includes a cam slot to receive the cam follower.

7. The chassis of claim 6, where the actuation rod is to impart a partial rotational movement to the bell crank.

8. The chassis of claim 1, further comprising:
 a controller module to at least one of control operation of the removable card or monitor operation of the removable card.

9. A retention device for a removable card, the retention device comprising:
 an actuation rod mounted on a chassis;
 a lever,
  a first end of the lever being connected to an end of the actuation rod,
  a second end of the lever being connected to the chassis; and
 a latch hook connected to the chassis,
  the latch hook pivoting between a first position and a second position,
  the first position allowing the removable card to be inserted into the chassis or removed from the chassis, and
  the second position allowing the removable card to be retained within the chassis.

10. The retention device of claim 9, further comprising:
 a pull handle connected to the actuation rod,
  the pull handle being used to remove the removable card from the chassis.

11. The retention device of claim 10, where the pull handle comprises a finger grip.

12. The retention device of claim 9, further comprising:
 a bell crank secured to a portion of the chassis,
 where a cam follower is affixed to the bell crank, and
 where the actuation rod includes a cam slot to receive the cam follower.

13. The retention device of claim 12, where the actuation rod is to impart a partial rotational movement to the bell crank.

14. The retention device of claim 9, further comprising:
 a connection rod,
  a first end of the connection rod being connected to the latch hook.

15. The retention device of claim 14, further comprising:
a bell crank connected to the chassis,
  a second end of the connection rod being connected to the bell crank.

16. A retention device for a removable card, the retention device comprising:
an actuation rod mounted on a chassis;
a lever,
  a first end of the lever being connected to an end of the actuation rod,
  a second end of the lever being connected to the chassis;
a bell crank connected to the chassis; and
a latch hook connected to the chassis,
  the latch hook being connected to the bell crank via a connection rod,
  the latch hook pivoting between a first position and a second position,
    the first position allowing the removable card to be inserted into the chassis or removed from the chassis, and
    the second position allowing the removable card to be retained within the chassis.

17. The retention device of claim 16, where a first end of the connection rod is connected to the latch hook, and
where a second end of the connection rod is connected to the bell crank.

18. The retention device of claim 16, where a cam follower is affixed to the bell crank,
where the actuation rod includes a cam slot to receive the cam follower, and
where the actuation rod is to impart a partial rotational movement to the bell crank.

19. The retention device of claim 16, further comprising:
a pull handle connected to the actuation rod,
  the pull handle being used to remove the removable card from the chassis.

20. The retention device of claim 19, where the pull handle comprises a finger grip.

* * * * *